United States Patent
Buehrer et al.

(10) Patent No.: US 7,737,014 B2
(45) Date of Patent: Jun. 15, 2010

(54) REDUCTION OF BORON DIFFUSIVITY IN PFETS

(75) Inventors: Frederick William Buehrer, Poughquag, NY (US); Dureseti Chidambarrao, Weston, CT (US); Bruce B. Doris, Brewster, NY (US); Hsiang-Jen Huang, Poughkeepsie, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 706 days.

(21) Appl. No.: 10/596,249

(22) PCT Filed: Dec. 8, 2003

(86) PCT No.: PCT/US03/39025

§ 371 (c)(1),
(2), (4) Date: Jun. 6, 2006

(87) PCT Pub. No.: WO2005/064665

PCT Pub. Date: Jul. 14, 2005

(65) Prior Publication Data

US 2007/0093030 A1  Apr. 26, 2007

(51) Int. Cl.
*H01L 21/22* (2006.01)
*H01L 21/38* (2006.01)

(52) U.S. Cl. .................. 438/542; 257/369; 257/408; 257/E21.135; 257/E21.466; 438/289; 438/301; 438/369; 438/559

(58) Field of Classification Search .................. 257/369, 257/408, E21.135, E21.466; 438/289, 301, 438/369, 542, 559
See application file for complete search history.

(56) References Cited

U.S. PATENT DOCUMENTS 5,439,831 A  8/1995  Schwalke et al.

(Continued)

FOREIGN PATENT DOCUMENTS

WO  WO9742652 A1  11/1997

(Continued)

OTHER PUBLICATIONS

Osada K. et al.; "Effect of Stress of the Deposited Silicon Nitride Films on Boron Diffusion in Silicon"—Electrochemical Society, vol. 93/1, May 16, 1993, pp. 1010.

(Continued)

*Primary Examiner*—Asok K Sarkar
(74) *Attorney, Agent, or Firm*—Whitham, Curtis, Christofferson & Cook, P.C.; Joseph P. Abate (57) ABSTRACT

A stressed film applied across a boundary defined by a structure or a body (e.g. substrate or layer) of semiconductor material provides a change from tensile to compressive stress in the semiconductor material proximate to the boundary and is used to modify boron diffusion rate during annealing and thus modify final boron concentrations. In the case of a field effect transistor, the gate structure may be formed with or without sidewalls to regulate the location of the boundary relative to source/drain, extension and/or halo implants. Different boron diffusion rates can be produced in the lateral and vertical directions and diffusion rates comparable to arsenic can be achieved. Reduction of junction capacitance of both nFETs and pFETs can be achieved simultaneously with the same process steps.

20 Claims, 9 Drawing Sheets

U.S. PATENT DOCUMENTS

| | | |
|---|---|---|
| 5,525,529 A | 6/1996 | Guldi |
| 5,719,424 A | 2/1998 | Ahmad et al. |
| 6,159,813 A | 12/2000 | Ahmad et al. |
| 6,882,025 B2 * | 4/2005 | Yeo et al. .................. 257/510 |
| 2002/0074612 A1 | 6/2002 | Bulucea et al. |

FOREIGN PATENT DOCUMENTS

| | | |
|---|---|---|
| WO | WO0180300 A1 | 10/2001 |

OTHER PUBLICATIONS

Hori T.; "A 0.1-Mum CMOS Technology With Tilt-Implanted Punchthrough Stopper (TIPS)"—Institute of Electrical and Electronics Engineers—Technical Digest of the International Electron Devices Meeting—IEEE, US, (Dec. 1994), vol. Meeting 40—pp. 75-78.

* cited by examiner

REDUCTION OF BORON DIFFUSIVITY IN PFETS

BACKGROUND OF THE INVENTION

1. Field of the Invention

The present invention generally relates to high density integrated circuits and, more particularly, to manufacture of field-effect transistors (FETs) at very small size regimes.

2. Description of the Prior Art

Performance and economic factors of integrated circuit design and manufacture have caused the scale of elements (e.g. transistors, capacitors and the like) of integrated circuits to be drastically reduced in size and increased in proximity on a chip. That is, increased integration density and proximity of elements reduces the signal propagation path length and reduces signal propagation time and susceptibility to noise and increase of possible clock rates while the reduction in element size necessary for increased integration density increases the ratio of functionality which can be provided on a chip (approaching, if not achieving, a "system on a chip") to the costs of production (e.g. wafer/chip area and process materials) per chip and, potentially, the cost of devices containing the chips by reducing the number of inter-chip and inter-board connections required in a complete apparatus.

Complementary field effect transistors, sometimes referred to as CMOS, have become the switching device technology of choice for all but the highest frequency designs of high density integrated circuits due to extremely low current drive requirements (which diminish at small size regimes since the load represented by the input is substantially capacitive) and other convenient and desirable properties. In this technology, field-effect transistors (FETs) of complementary conductivity type are used in pairs (e.g. a series connection of a pFET and an nFET having a common input) to obtain a complementary and, preferably substantially symmetric switching function. However, to obtain a reasonable degree of symmetry, generally similar electrical properties must be developed in the complementary transistors forming each pair of transistors notwithstanding the different semiconductor conductivity types and majority charge carriers therein.

At extremely small size regimes currently and foreseeably of interest (e.g. about 60 nm channel length and smaller), performance of FETs is often degraded by so-called short channel effects unless special structures such as extension and/or halo implants are employed to maintain acceptable levels of performance. However, the difference in physical behavior of dopants for semiconductors used to produce different conductivity types of transistors presents substantial difficulties in manufacture of FETs, particularly including such structures having acceptable electrical performance at acceptable manufacturing yields. In particular, boron is generally used for extension and source/drain implants in pFETs and in halo implants in nFETs (sometimes with indium) while arsenic (and/or phosphorus) is used for the extension and source/drain implant structures in nFETs and halo implants in pFETs. While arsenic diffuses sufficiently slowly in silicon at annealing temperatures to allow shallow and abrupt junctions to be maintained at the source, and drain of nFETs, boron diffuses at a much faster rate at the same temperatures. The faster diffusion rate of boron causes the tip of the impurity region of extension implants to spread under the transistor gate, shortening the channel further and increasing the junction depth within the silicon, compromising a shallow channel geometry that allows the channel conductivity to be suitably controlled at low gate threshold voltages. Therefore, there is a trade-off between low resistance extensions and source/drain regions which require a high temperature activation annealing process and shallow junctions to maintain suitable switching thresholds and avoid undesirable rolloff effects (e.g. a reduction of switching threshold with reduction of channel length) which can lead to unacceptably low switching thresholds at short channel lengths.

It is known in the art to provide halo implants (e.g. counter doping of the opposite impurity type below the source/drain and extension implant regions) to partially offset poor rolloff characteristics. However, halo implants require substantial process complexity while degrading carrier mobility and transistor reliability. Further, the high diffusivity of boron prevents use of extremely narrow spacers for self-aligned source/drain implants which are important to maintaining a low external resistance for the transistor while a larger spacer also tends to increase overall size of the transistor.

More specifically, current microprocessor and "system on a chip" designs require devices to be made without silicide on source, drain or gate regions. Suitable processes are sometimes referred to as OP processes in which a hard mask of, for example, silicon nitride, is patterned and used to block formation of silicide or salicide. High performance circuits also require high temperature annealing to activate junctions. During such an anneal, boron will diffuse over substantial distances sufficient to substantially degrade transistor performance.

It is also known that the diffusivity of boron in silicon can be reduced by application of a high compressive force thereto. However, mechanical application of stress levels sufficient to significantly affect diffusivity of boron in silicon is difficult to achieve or regulate and may cause damage such as cracking to the wafer. Further, compressive force in the channel region of an nFET is known to reduce electron mobility and compromise device performance if not removed as the transistor is completed. The same is true of tensile force (which may result from compressive force applied elsewhere on the chip or wafer) in regard to hole mobility in pFETs.

It is known to apply compressive force to individual devices on silicon chips by deposition of a material on a surface or in a trench surrounding the device and then reducing the volume of the deposited material as disclosed in U.S. Pat. Nos. 6,069,049 and 6,399,976 which are assigned to the assignee of the present invention and fully incorporated by reference herein. However, the force developed in accordance with this technique is persistent and the structure is intended to remain in the completed chip to avoid propagation of crystal lattice defects. The forces produced in this manner may not be suitable in magnitude or location for reduction of boron diffusivity. In particular, the location of forces produced in this manner is not compatible with fabrication of high performance logic transistors, since high performance CMOS does not utilize capacitors in memory cells or random logic circuitry.

Additionally, junction capacitance (Cj) is a major parasitic element which arises from the depletion charge between the source/drain implant and the oppositely doped substrate which contributes to switching delay in CMOS circuits and is a significant part of the output capacitance in bulk CMOS circuits. Limitation of junction capacitance has been approached through use of expensive silicon-on-insulator structures which have an inherently lower junction capacitance than bulk FETs. In bulk FETs, implants have been used to reduce junction capacitance by developing graded junctions. However, at particularly small feature size regimes, boron diffusivity in the horizontal direction increases process parameter criticality in nFETs where boron is used (sometimes with indium) for the halo implants. In pFETs, lateral diffusion of the source/drain implants can reduce the perimeter component of junction capacitance by compensating the halo implant, thereby eliminating the p-n junction between the source/drain and the halo which reduces the overall junction capacitance. However, excessive boron diffusion in the vertical direction can lead to an increase in the area component of junction capacitance. Thus, if the lateral diffusion of boron in the source/drain region can be increased without causing increased overlap capacitance and, simultaneously, the vertical diffusion of boron in the source/drain region can be minimized, then junction capacitance can be significantly reduced. The increase in junction capacitance with increased compressive forces from shallow trench isolation (STI) structures has been reported and attributed to change in band gap in "Stress-Induced Increase in Reverse Bias Junction Capacitance" by V. P. Gopinath et al., IEEE Electron Device Letters, Vol. 23, No. 6, June 2002. This effect is not considered to be fully understood but could possibly be explained by either stress-induced alteration of vertical diffusion of impurities or stress induced band gap change with compressive force as the author of the article proposes or a combination thereof. In any case, the use of STI or other structures providing a compressive force across transistors for the purpose of reducing boron diffusivity compromises transistor performance by increasing junction capacitance.

Another component of parasitic capacitance which may degrade FET switching speed is referred to as overlap capacitance (Cov) which is basically the capacitance between the gate electrode and the extension implants in the area where the former overlaps the latter. As can be readily appreciated in view of the above discussion, overlap capacitance is increased by the increased distance of boron diffusion in pFETs.

SUMMARY OF THE INVENTION

It is therefore an object of the present invention to provide a technique and structure for localized application of compressive stress sufficient to significantly modify boron diffusivity in transistors of small size regimes to avoid deleterious channel shortening and increase of overlap capacitance in pFETs.

It is another object of the invention to provide a structure which lends itself to integration with high performance logic and system-on-chip fabrication and reduces junction capacitance in both nFETs and pFETs consistent with modification of boron and arsenic diffusivity.

In order to accomplish these and other objects of the invention, a method for modifying a diffusions rate of an impurity implanted in a semiconductor material including steps of defining a boundary with a structure on a surface of the semiconductor material, applying a stressed film over the structure and surface at the boundary, and annealing the semiconductor material to activate said impurities.

In accordance with another aspect of the invention, an intermediate product useful in the manufacture of semiconductor devices which include a structure defining a boundary on a surface of a body (e.g. substrate or layer) of semiconductor material having implanted impurities and a stressed film over the structure and body of semiconductor material at the boundary.

In accordance with further aspects of the invention, a transistor and/or integrated circuit are provided which have differing boron concentration profiles reflecting different boron diffusion rates in the lateral and vertical directions and/or between extension implants of pFETs and halo implants of nFETs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
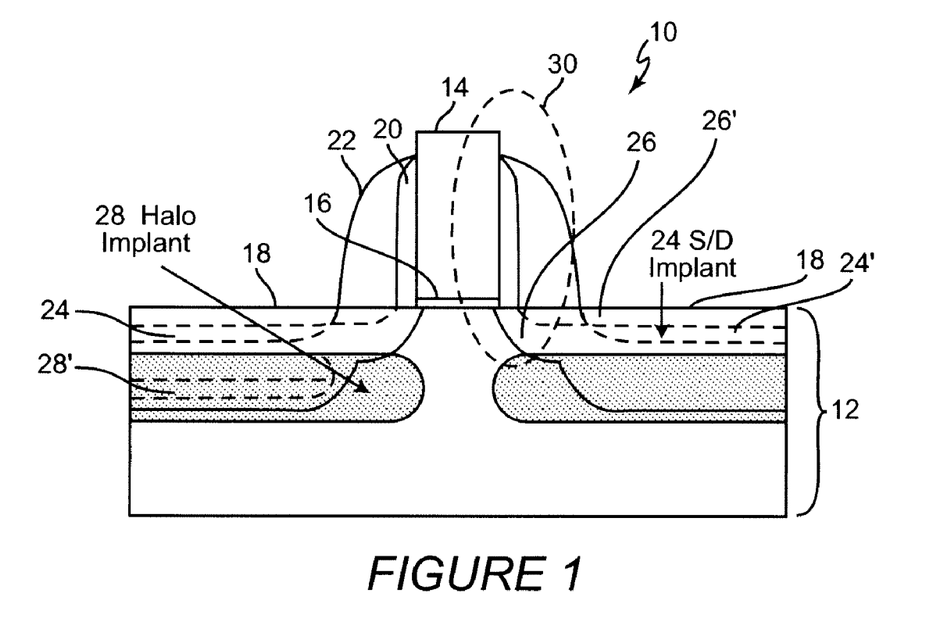
FIG. 1 is a cross-sectional view of an exemplary transistor structure showing desired implant structures.

Referring now to the drawings, and more particularly to FIG. 1, there is shown, in cross-section, an exemplary form of a field effect transistor 10 suitable for fabrication at current small feature size regimes. The transistor structure, including source/drain, extension and halo implants are idealized and, while such ideal structures may be closely approached at larger size regimes, should be viewed as a goal of the present invention at the size regimes currently of interest. For that reason and because FIG. 1 is also arranged to illustrate problems addressed by the invention and the structure illustrated can, in fact, be closely approached by processes in accordance with the invention, no portion of FIG. 1 is admitted to be prior art in regard to the present invention.

Transistor 10 is formed on substrate 12 by formation of a gate structure 14 including a thin gate oxide 16 and source and drain regions 18 on opposite sides thereof. To enhance performance when formed at small size, offset spacers 20 are formed on the sides of the gate structure 14 and extension implants 26' made in accordance therewith. A thicker spacer 22, sometimes referred to as a source/drain (S/D) spacer, is then applied to control the placement of the source/drain (S/D) implants 24'. When the impurity activation anneal is performed, the extension implant 26, S/D implant 24 and halo implant 28 assume approximately the forms shown if the diffusivity is relatively slow, as it is for arsenic. However, it can be appreciated that a relatively greater diffusivity of boron will expand these regions disproportionately; causing the extension implants in pFETs and halo implants in nFETs to closely approach if not contact each other under gate 14.

Figure 2:
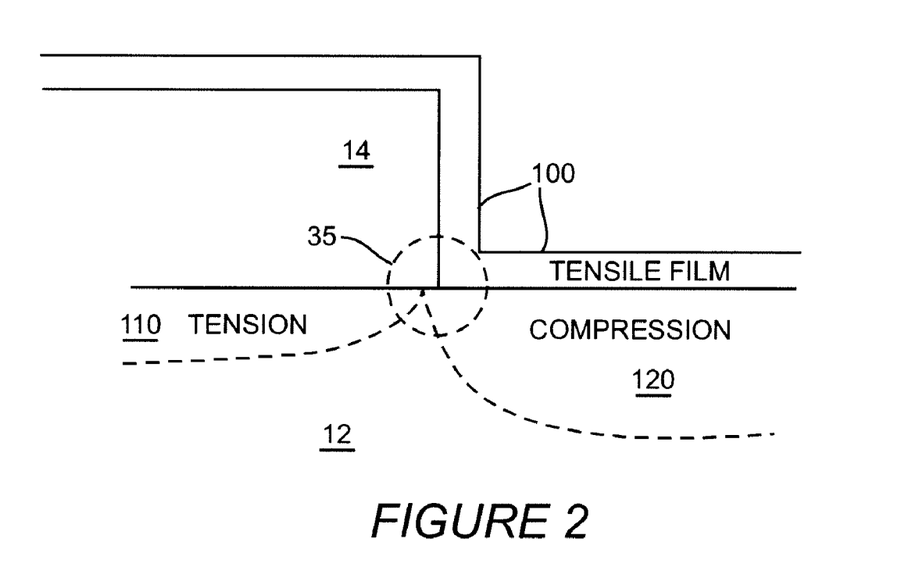
FIG. 2 is a cross-sectional view of a structure implementing the invention in accordance with its basic principles.

FIG. 2 shows a simplified structure for implementing the invention in accordance with its most basic principles. The structure illustrated in cross-section in FIG. 2 approximately corresponds to the region identified by dashed line 30 of FIG. 1 and includes a portion of substrate 12, and portion of gate 14 (gate oxide 16 being omitted in the interest of clarity since it is not important to the invention or its practice) and a stressed (tensile) film 100. Stressed film 100 is preferably formed of silicon nitride or silicon oxynitride, although other materials are suitable for forming stressed films suitable for practice of the invention. The thickness of film 100 should generally be as great as possible consistent with the level of adhesion between the film and the underlying material. However, adhesion between silicon nitride or silicon oxynitride and underlying silicon is generally adequate for the successful practice of the invention to realize its meritorious effects without necessitating any adhesion enhancement. However, the use of a thin intervening adhesion enhancing layer in a manner well-understood in the art can be applied if needed. Within this constraint, the thickness and internal stresses of film 100 can be varied at will to regulate the rate of diffusion of boron and arsenic. In this regard, Plasma Enhanced Chemical Vapor Deposition (PECVD) silicon nitride can be deposited at a relatively low temperature (e.g. 400° C. to 500° C.) with the stress level mainly controlled by plasma power; higher power, in general, yielding a more compressive stress. On the other hand, thermal CVD silicon nitride is deposited at a temperature above 600° C. and is normally tensile with stress readily controllable through a combination of deposition parameters including temperature and precursor flow rate and for which, empirical data is known. A thickness of film 100 between 300 Å and 2000 Å is generally preferred and adequate for practice of the invention. Nitride films of a thickness near the upper end of this range exhibit a stress of about +1.5 GPa to +2.0 GPa and the inventors have found that the stress increases at annealing temperature by a factor of two to three or more.

It should also be understood that application of a stressed film to a surface of a body will cause a stress of the opposite sign in that body in the region where the film contacts that body. That is, a tensile film will develop a compressive force in the body that directly underlies the film. However, when such forces are so localized, the sign of the stress in adjacent areas will be of opposite sign. Thus, a compressive stress in a region of a body of material will be accompanied by an adjacent region of tensile stress (as depicted at regions 110 and 120 of FIG. 2) and vice-versa. Thus, a tensile film deposited in the configuration shown in FIG. 2 will cause a high compressional stress to be applied to the substrate which extends slightly under the gate 14 or other structure such as a sidewall spacer or insulator layer which may be applied. It should also be noted that such an additional structure is normally employed to control placement of impurity ions during the various implants discussed above.

Figure 3A:
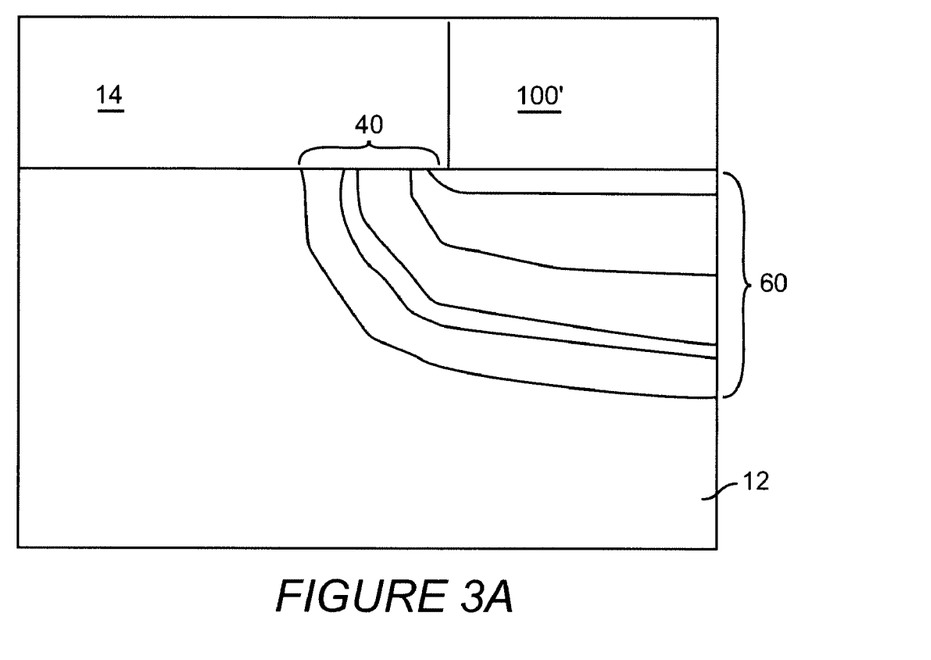
FIGS. 3A and 3B are simulations of a cross-section of a structure corresponding to FIG. 2 showing the effect of that structure on boron diffusion during impurity activation annealing.
Figure 3B:
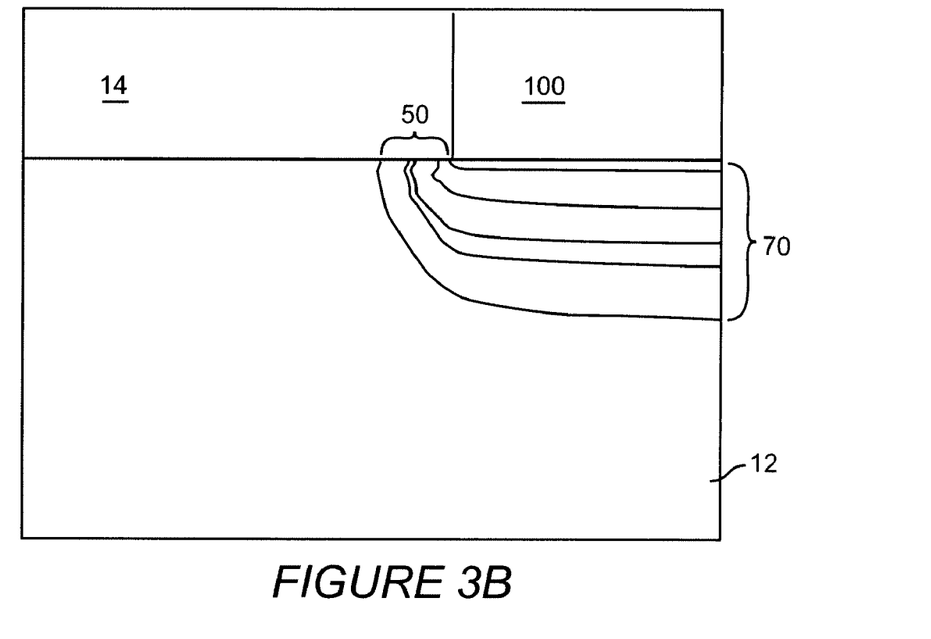

The effects of stressed film 100 on the rate of boron diffusion (as simulated) are depicted in FIG. 3B, approximately corresponding to the region identified by dashed line 35 of FIG. 2. The simulations depict boron concentrations after annealing at approximately 1000° C. for a duration sufficient to activate the implanted impurities. For comparison, the simulation of FIG. 3A assumes an unstressed film 100' otherwise identical to stressed film 100 of FIG. 3B. It can readily be seen that diffusion 50 under the gate 14 is much reduced in comparison with diffusion 40 of FIG. 3A and largely maintained in the region of compression extending under the gate as depicted in FIG. 2. Further, while the boron concentration generally spreads and results in an angled gradient of impurity concentration under film 100' and a relatively large vertical diffusion distance 60 in FIG. 3A, the boron diffusion under stressed film 100 has a much more nearly vertical gradient and uniform thickness of the implanted and diffused region with a much smaller vertical diffusion distance (e.g. 70). The reduction in diffusivity thus achieved for boron sufficient to prevent compromise of pFET electrical characteristics by excessive boron diffusion.

Therefore, it is seen that the provision of a localized stress using a film over a structure providing a boundary transition between compressive and tensile stresses in a substrate can dramatically reduce and closely control boron diffusion rates under conditions of annealing (e.g. rapid thermal annealing (RTA)) which is sufficient for impurity activation in a FET. It should also be appreciated that this effect is largely isotropic (e.g. to reduce boron diffusivity substantially omnidirectionally and extends well within the depth of the substrate to 100 Å to 500 Å.

It should also be appreciated that such an effect can be achieved by only two additional process steps beyond those usually required for production of a transistor having a structure similar to that of FIG. 1. That is, after the basic steps of forming isolation structures (e.g. STI), forming a gate oxide layer, forming patterned gate electrodes, reox (forming a thin oxide to round lower corners of the gate oxide), separate nFET and pFET extension and halo implants, spacer formation and separate nFET and pFET S/D implants but before the impurity activation anneal, tensile layer 100 is formed. Then the anneal process is carried out while the pFET S/D regions are under compressive stress from the tensile film 100 (which stress is substantially increased during annealing, as alluded to above). Then, after annealing is complete, tensile film 100 is removed and the transistor completed in a known manner but which may include application of other stressed films or other stressed structures to enhance carrier mobility as disclosed in U.S. patent application Ser. No. 10/695,752, 10/695,754, or 10/695,748, filed Oct. 30, 2003, which are hereby fully incorporated by reference. Thus, the meritorious effects of the invention can be achieved by the inclusion of the steps of adding and removing a stressed film wherein adequate stresses can be achieved at temperatures of about 600° C. that does not cause significant diffusion, even of boron, during formation of the stressed film 100.

Figure 4:
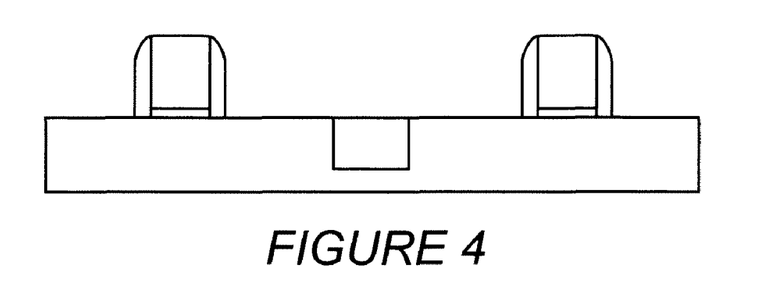
FIGS. 4, 5, 6, 7, 8, 9, 10, 11, 12 and 13 are a sequence of cross-sectional views illustrating formation of a pair of complementary transistors in accordance with a preferred embodiment of the invention.
Figure 5:
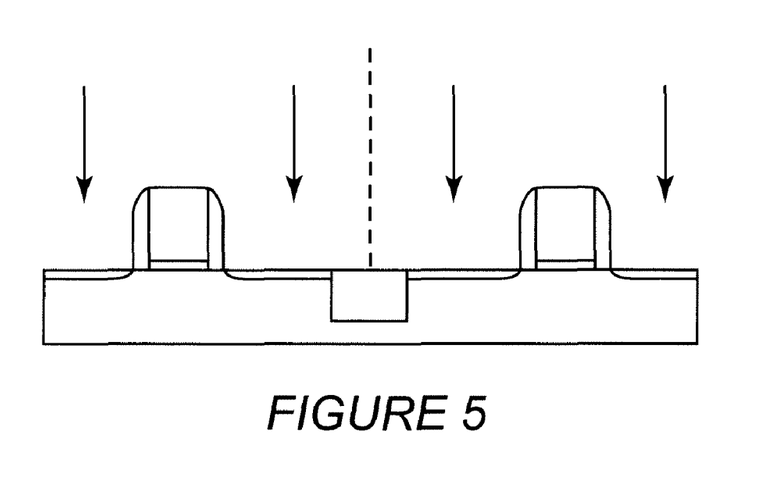

Referring now to FIGS. 4-13, a preferred implementation and embodiment of the invention will be described in connection with the manufacture of a CMOS transistor pair. For convenience and brevity, this process will be assumed to begin with a substrate on which two complementary transistors have already been formed by processes well-understood in the art and which have also been largely enumerated above. That is, as shown in FIG. 4, gate oxide and respective gate structures have been formed in regions of a substrate of different conductivity types and separated by an STI structure. Also, as is preferred, offset spacers have been formed on the sides of the gate structures to set back or recess the extension implants from the gate electrode as a precompensation for impurity diffusion. These extension implants are depicted by arrows in FIG. 5 and are performed in separate processes for the pFET and nFET, respectively.

Figure 6:
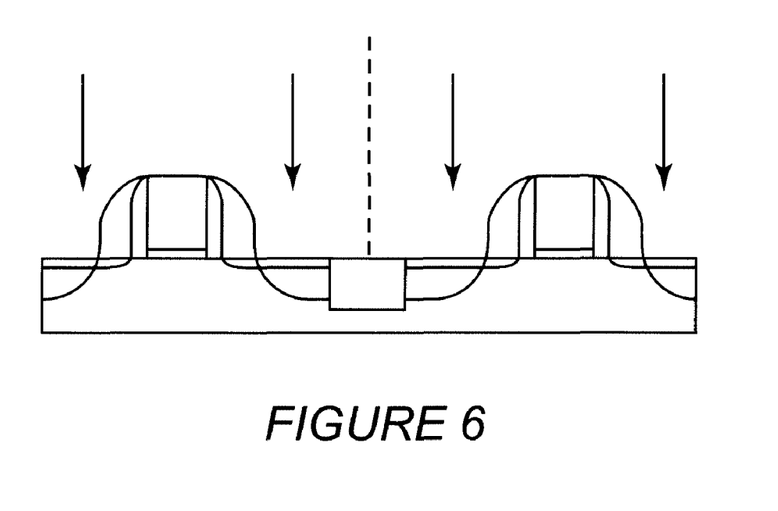

Then, as shown in FIG. 6, a further, generally thick, spacer is applied by an isotropic deposition and anisotropic etch of an insulating material such as oxide or (preferably unstressed) nitride. It should be understood that the thickness of these spacers is largely determined by the diffusion distance of the impurities during annealing and result in a set back or recess of the S/D regions from the gate with a relatively high resistance extension region extending between the channel and the source or drain; increasing external resistance, which is undesirable. Further, if the diffusion rates are significantly different as they are between boron and arsenic, a difference in the thickness or width of the spacers may be required and which implies that additional processes must be used; undesirably increasing process complexity. Conversely, control of boron diffusion in the lateral and vertical directions along with optimization of the spacer dimension in accordance with the invention enables significantly improved junction capacitance.

Figure 7:
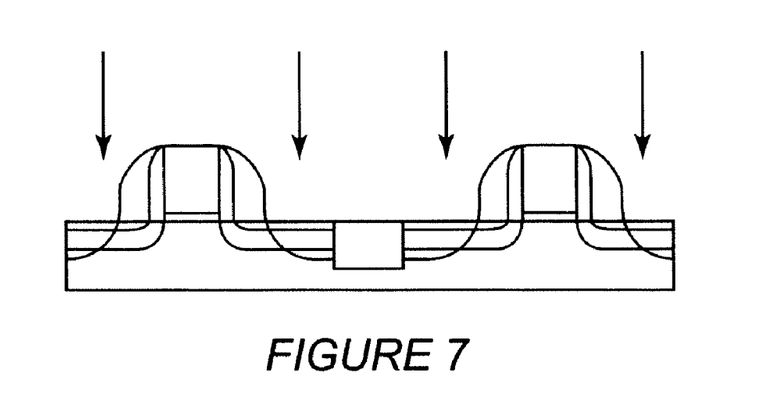

The formation of these spacers is followed by higher energy and concentration S/D implant processes (FIG. 6) and halo implant processes (FIG. 7) for the respective transistor conductivity types. As with the extension implant processes, the processes are separated for the respective conductivity types using block-out masks as is well-understood in the art. The final shape and location of the extension, S/D and halo implants (prior to annealing) is shown in FIG. 7.

Figure 8:
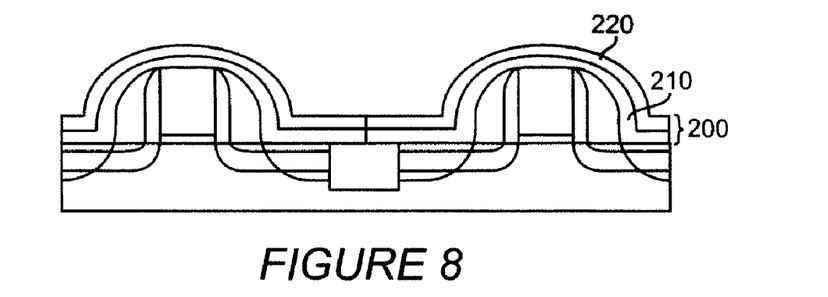

Referring now to FIG. 8, a film stack 200 preferably comprising a layer of unstressed oxide 210 followed by a layer 220 of tensile nitride or oxynitride is applied. The first layer 210 should be as thin as possible and a thickness of about 50 Å is preferred and sufficient for the practice of the invention. This layer is primarily provided to facilitate later removal of the overlying stressed layer and, for that reason, should be of a material which resists etching by etchants suitable for removal of the stressed layer and also etchable selectively to the underlying material. It also appears, from the experimental results which will be discussed below, that layer 210, when used in combination with a highly stressed tensile film 220 may alter the distribution of stresses somewhat from that of FIG. 2 to yield a somewhat different distribution of boron that may be advantageous in some circumstances. The thickness of the tensile layer 220 should be determined as discussed above.

Figure 9:
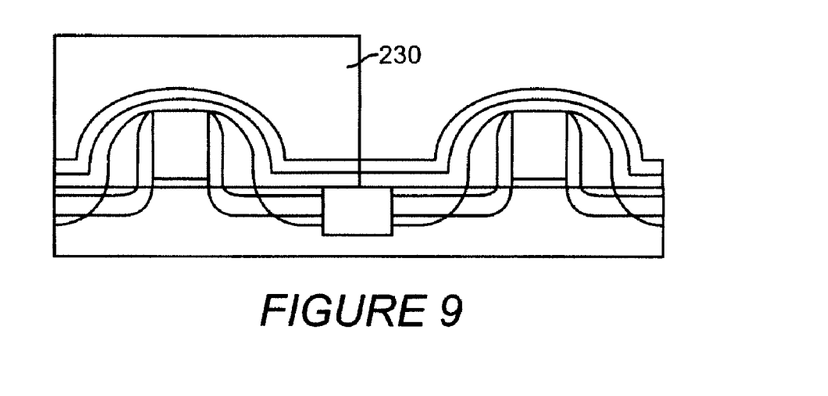
Figure 10:
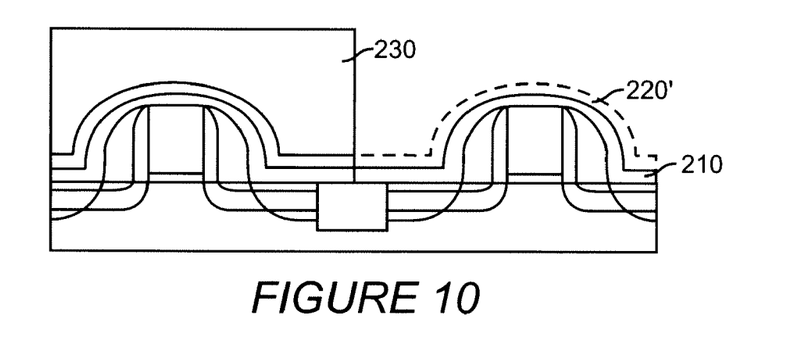
Figure 11:
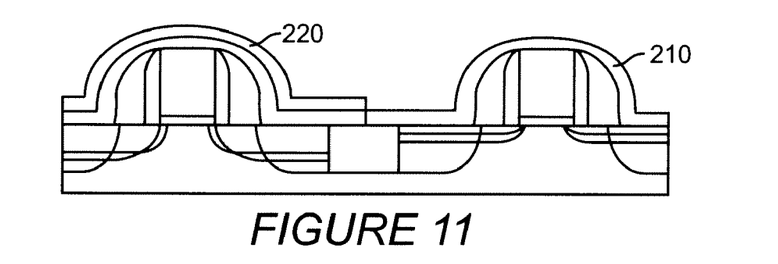
Figure 12:
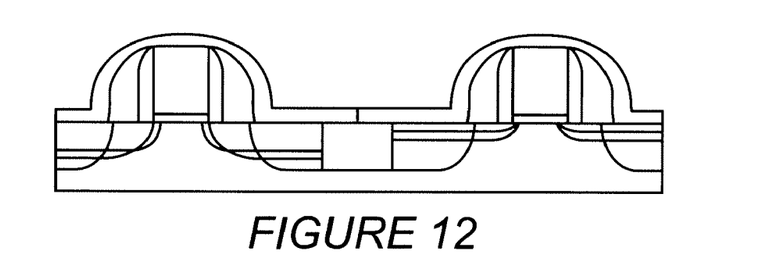
Figure 13:
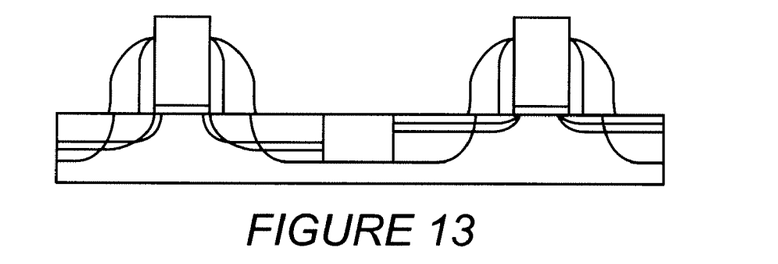

Then, as shown in FIG. 9 the pFET transistor is masked with a block-out mask and the tensile layer removed, as shown in FIG. 10. The wafer is then annealed, preferably by a rapid thermal annealing (RTA) process resulting in the formation of the extension, S/D and halo implant impurity distributions as shown in FIG. 11. It should be noted that the annealing while the pFET is stressed much in the manner of FIG. 2, as discussed above, controls the boron diffusion from the extension and S/D implants. This slightly greater diffusion increases the width of the graded junction in the nFET with the beneficial effect of reducing junction capacitance while the reduction of boron diffusion by compressive stress reduces junction capacitance in the pFET as will be discussed in greater detail below.

A unique aspect of this invention is that by applying a stressed film at this point in the process, a structure comprising the stressed film directly on top of the thin $SiO_2$ layer and/or Si with a high dose of boron in the range of $2 \times 10^{15}$ to $6 \times 10^{15}$ atoms/cm$^2$ is formed. Directly adjacent to the high dose region of boron is a less highly doped region of boron of about $1.5 \times 10^{14}$ to about 3 to $5 \times 10^{14}$ atoms/cm$^2$ located directly under the source/drain spacers. The peak region of the halo implant, typically arsenic, is located underneath the lightly doped extension region. The geometry prior to annealing is shown in FIG. 7.

While not wishing to be held to any particular theory of diffusion of impurities due to annealing, it is believed that after the anneal, the boron doped region under the source/drain regions diffuses laterally while the boron in the source/drain regions does not diffuse appreciably. The reason for these effects may be due to the fact that the tensile film creates a compressive region in the silicon directly beneath it which reduces the boron diffusion in the source/drain region. Additionally the region directly adjacent to the compressive region in the silicon (below the spacer(s)) is a tensile strained region in the silicon which contains boron for the extension. It is believed that in this tensile region, the boron diffuses faster and thus eliminates part of the extension-halo junction which significantly reduces junction capacitance. As has been described, using the method of the invention in this particular geometry enables reduced boron diffusion in the vertical direction from S/D and/or extension implants but increased diffusion in the lateral direction from extension implants (which, being adjacent to the region under compression from the tensile film, are under tensile stress). By rigorous optimization of the spacer dimensions, overlap capacitance is not significantly changed as will be evidenced by the data discussed below.

Another embodiment wherein the spacers are removed prior to application of the tensile film can be used to reduce boron diffusion in the extension. In this case, the spacers are removed by a dry etch, known in the art, which is capable of removing the silicon nitride spacer but not capable of removing the silicon. The tensile film is next applied, followed by annealing. Annealing the boron under the influence of the compression induced by the tensile film results in a shallow junction with similar activation (whether or not a halo implant is provided).

FIGS. 14-17 graphically illustrate the efficacy of the invention in regard to reduction of junction capacitance through the method and structure as depicted in FIGS. 4-13 and further indicate that the meritorious effects in both nFETs and pFETs are directly attributable to this process and the use of a stressed film therein. It should be noted that FIGS. 14-17 depict statistical distributions of capacitance values achieved by annealing transistor structures 1.) without film stack 200, 2.) with only unstressed layer 210 over the transistors and 3.) with film stack 200 including both layers 210 and 220 in place.

Figure 14:
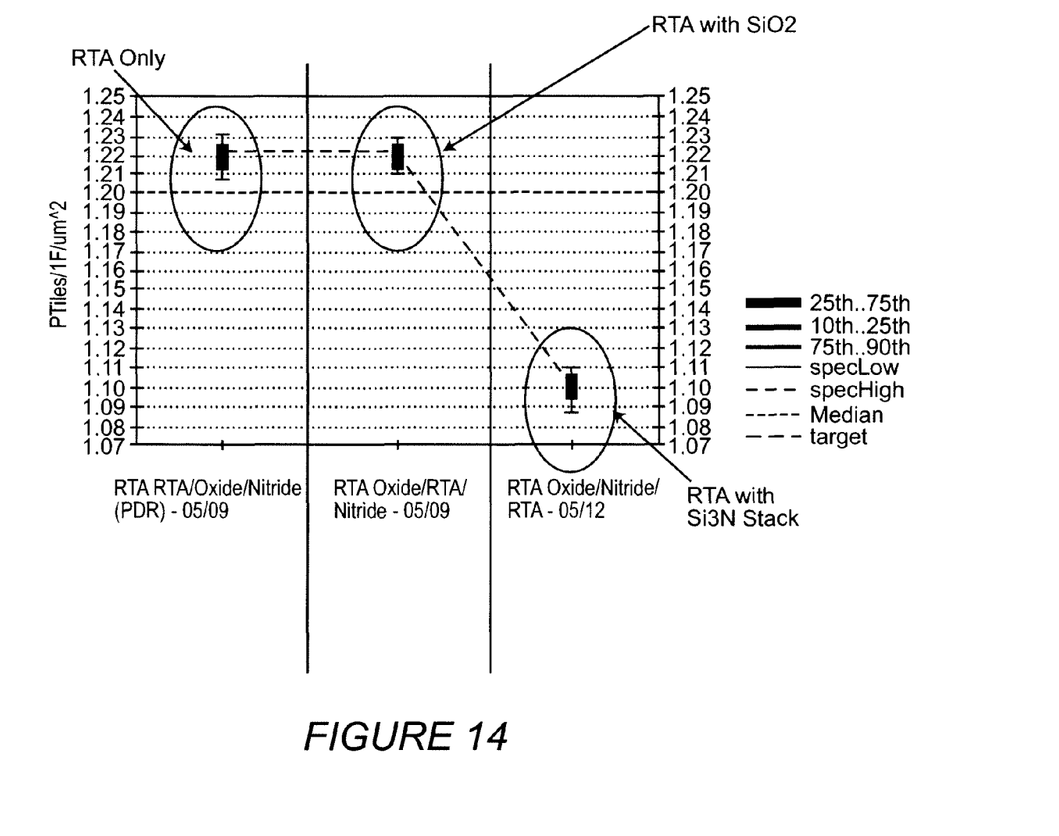
FIGS. 14, 15, 16 and 17 illustrate the comparative beneficial effects of the preferred embodiment of the invention on junction capacitance.

Specifically, FIG. 14 shows the junction capacitance of pFETs fabricated in accordance with the invention. No change in junction capacitance results from annealing with only layer 210 in place but junction capacitance is reduced dramatically using both layers 210 and 220. Therefore, the reduction in junction capacitance in pFETs is directly attributable to the use of a highly tensile film during annealing.

Figure 15:
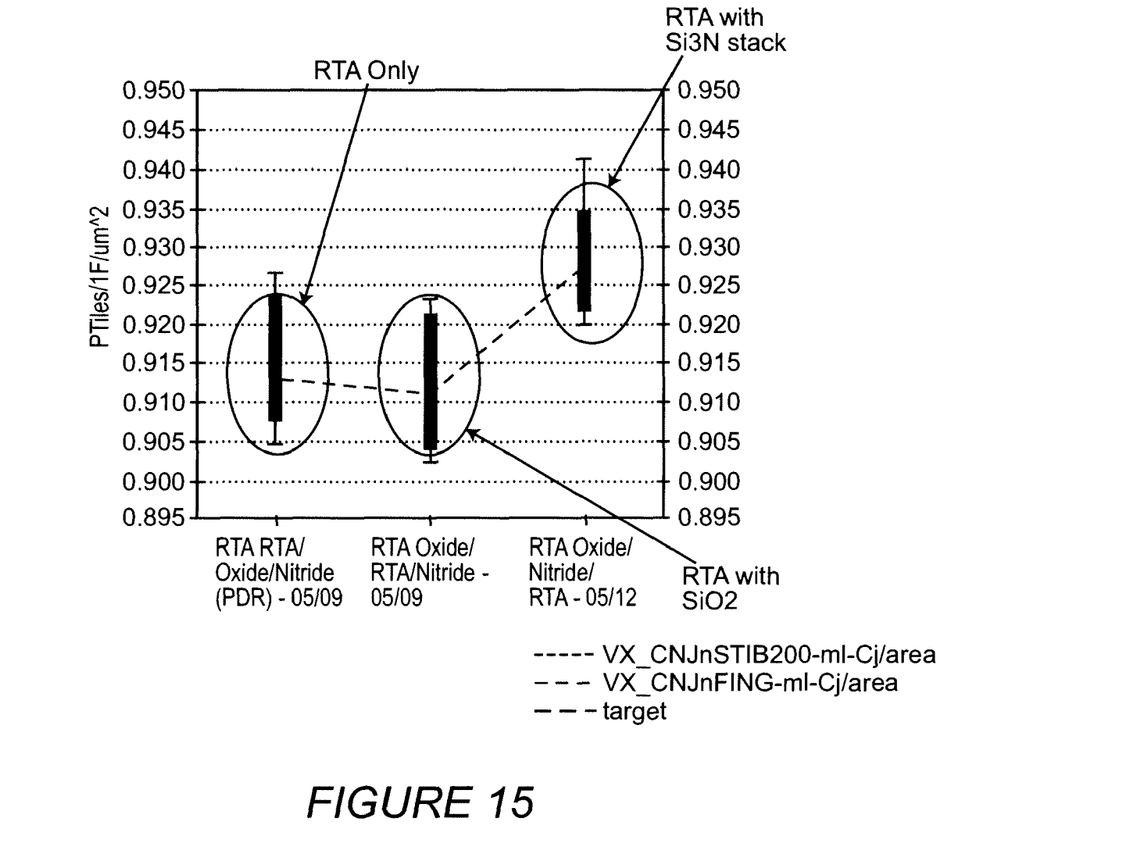

FIG. 15 demonstrates a substantially opposite effect on nFETs, with junction capacitance increasing if a highly tensile film is applied during annealing. For this reason, it is particularly desirable to remove the stressed nitride from the nFETs as discussed above in regard to FIG. 10. This also suggests that it may be possible to achieve further reduction in junction capacitance of nFETs by application of a compressive film in place of the removed tensile film. While this could be accomplished with the same block-out mask 230 there would necessarily be a significant increase in process complexity while the junction capacitance of nFETs is enhanced to a significant degree in accordance with the invention as will be discussed below even without a compressive film.

Figure 16:
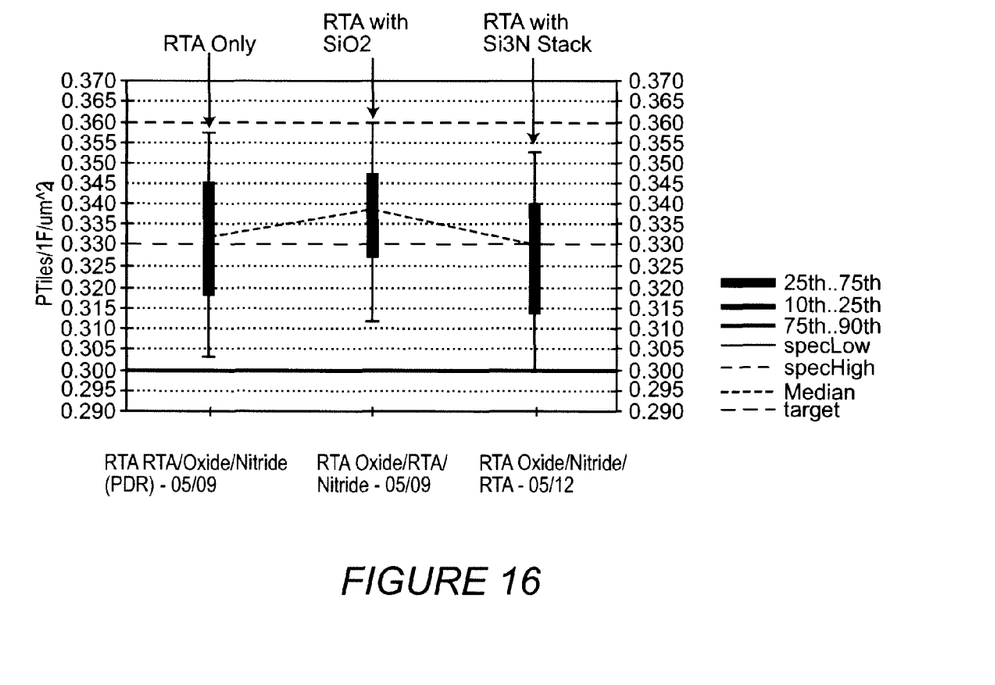
Figure 17:
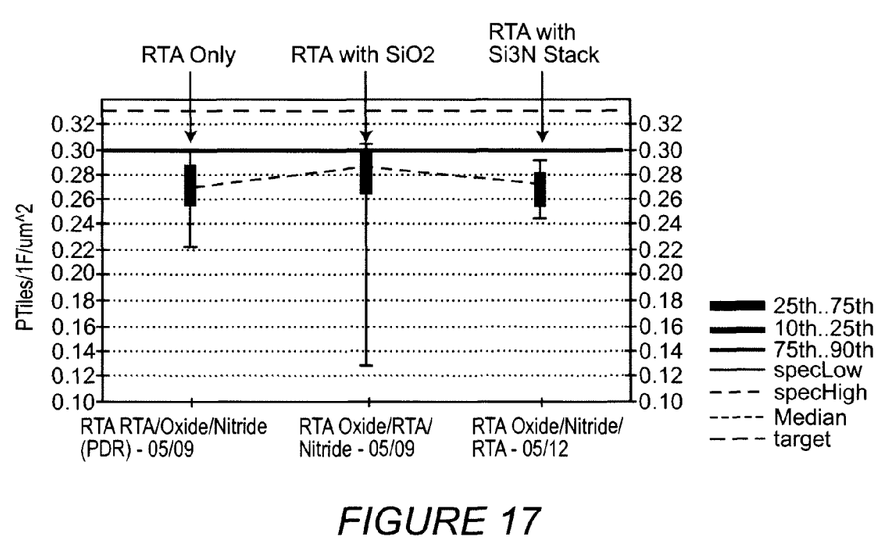

FIGS. 16 and 17 demonstrates that nFET and pFET overlap capacitance, respectively, are not affected by the use of layer 210 or both layers 210 and 220. This suggests that diffusion in the horizontal direction in the proximity of the extension overlap region is not affected by application of stress in shear through layer 210 from film 220 while diffusion in the vertical direction can be readily controlled in accordance with the invention. In this regard, control of diffusion in the vertical direction for pFETs by application of stress during annealing while leaving nFETs substantially unstressed (due to the removal of the tensile film over nFETs) allows the boron halo implants in the nFETs to diffuse relatively more, enhancing the grading of the nFET junctions and reducing nFET junction capacitance by a different mechanism (e.g. reduction of junction area) and resulting in somewhat different impurity distributions in the pFET and nFET as is illustrated in FIG. 11; thus providing junction capacitance reduction simultaneously by the same process steps in both pFETs and nFETs on the same substrate even though different mechanisms are involved. Further, where the location of the change in sign of stress in the silicon (e.g. from compressive to tensile) by use of a sidewall on the gate structure with the tensile film covering both the sidewall and the gate (thus placing the halo implant region and the extension implant region above it in tension), the enhancement of boron diffusion from the halo implant in nFETs may be further increased by leaving the tensile film in place (or providing a different tensile film yielding a different level of stress) as shown by dashed line 220' in FIG. 10 and which would tend to further decrease both the area and depth of the nFET junctions. Suitable regulation of these techniques can provide numerous advantageous configurations of the concentration profiles of different impurities including substantial symmetry of boron and arsenic profiles in both nFETs and pFETs, respectively.

In view of the foregoing, it is seen that the invention provides a method of manufacture of semiconductor devices in which diffusion of boron can be readily controlled and made comparable to that of arsenic to prevent, for example, foreshortening of transistor channels and other effects in pFETs which can compromise manufacturing yield and electrical performance as well as providing reduction of junction capacitance in both nFETs and pFETs on the same substrate in a manner decoupled from effects on overlap capacitance.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for selectively modifying a diffusion rate of an impurity implanted in a semiconductor material including steps of
   defining a boundary with a structure on a surface of said semiconductor material,
   applying a stressed film over said structure and said surface at said boundary, and
   annealing said semiconductor material to activate said impurities, wherein compressive forces developed by said stressed film are concentrated at said boundary such that said diffusion rate of said impurity is modified in both lateral and vertical directions in a region of said semiconductor material adjacent to said boundary after said applying step to be comparable to a diffusion rate of another impurity.

2. The method as recited in claim 1, wherein said structure on said surface of said semiconductor material is a gate structure of a field effect transistor.

3. The method as recited in claim 2, wherein said boundary is defined by a sidewall of said gate structure.

4. The method as recited in claim 3, wherein said sidewall is an offset spacer.

5. The method as recited in claim 3, wherein said sidewall is a source/drain spacer.

6. The method as recited in claim 2, wherein said boundary is defined by a gate electrode of said gate structure.

7. The method as recited in claim 1, further including steps of
   implanting extension impurities,
   implanting source/drain impurities, and
   implanting halo impurities.

8. The method as recited in claim 1 wherein a plurality of said structures are provided on said surface of said semiconductor material, further including a step of
   removing said stressed film from a selected said structure prior to said annealing step.

9. The method as recited in claim 8, wherein said plurality of structures include gate structures of pFETs and nFETs.

10. The method as recited in claim 9, wherein said boundary is defined by a sidewall of said gate structures.

11. The method as recited in claim 10, wherein said sidewall is an offset spacer.

12. The method as recited in claim 10, wherein said sidewall is a source/drain spacer.

13. The method as recited in claim 1, wherein said stressed film is a tensile film.

14. An intermediate structure for formation of a semiconductor device, said intermediate structure comprising
   a body of semiconductor material including respective regions implanted with boron and arsenic impurities,
   a structure on a surface on said body of semiconductor material and forming a boundary with said structure, and
   a stressed film extending over said structure and said boundary,
   wherein when said intermediate structure is annealed to activate said boron and arsenic impurities, wherein compressive forces developed by said stressed film are concentrated at said boundary such that a diffusion rate of said boron impurities is selectively modified in both lateral and vertical directions in a region of said semiconductor material adjacent to said boundary to be comparable to a diffusion rate of another impurity.

15. The intermediate structure as recited in claim 14, wherein said structure is a gate structure of a field effect transistor.

16. The intermediate structure as recited in claim 15, wherein said gate structure includes a sidewall.

17. The intermediate structure as recited in claim 16, wherein said sidewall is an offset spacer.

18. The intermediate structure as recited in claim 16, wherein said sidewall is a source/drain spacer.

19. An integrated circuit comprising
   a pFET, and
   an nFET
   wherein a boron diffusion concentration profile from extension implants in said pFET corresponds to a lower boron diffusion rate than a boron diffusion rate corresponding to a boron diffusion concentration profile from a boron halo implant in said nFET.

20. A pFET including
   a source/drain region formed by implantation with boron, and
   an extension region formed by implantation with boron,
   wherein a boron concentration profile of said extension region in a lateral direction differs from a boron concentration profile in a vertical direction.

* * * * *